United States Patent
Ohtake et al.

(10) Patent No.: US 7,400,531 B2
(45) Date of Patent: Jul. 15, 2008

(54) SEMICONDUCTOR INTEGRATED CIRCUIT DEVICE

(75) Inventors: Hiroyuki Ohtake, Tokyo (JP); Hiroyuki Dohmae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 11/453,996

(22) Filed: Jun. 16, 2006

(65) Prior Publication Data
US 2007/0002638 A1   Jan. 4, 2007

(30) Foreign Application Priority Data
Jun. 23, 2005  (JP)  ............................. 2005-183483

(51) Int. Cl.
*G11C 16/04* (2006.01)

(52) U.S. Cl. .................. 365/185.11; 365/235; 365/236

(58) Field of Classification Search ............ 365/185.11, 365/235, 236
See application file for complete search history.

(56) References Cited

U.S. PATENT DOCUMENTS
6,807,102 B2 * 10/2004 Imamiya et al. ........ 365/185.22
2005/0018483 A1 * 1/2005 Imamiya et al. ........ 365/185.09

FOREIGN PATENT DOCUMENTS
JP        5-314780        11/1993

* cited by examiner

*Primary Examiner*—Thong Q Le
(74) *Attorney, Agent, or Firm*—Oblon, Spivak, McClelland, Maier & Neustadt, P.C.

(57) ABSTRACT

A semiconductor integrated circuit device has a page buffer, several memory cells to which data is written in accordance with write data stored in the page buffer, and an accumulating counter. The accumulating counter accumulates and stores a number of program loops spent for data write to several memory cells, and outputs the accumulated and stored number of program loops.

12 Claims, 9 Drawing Sheets

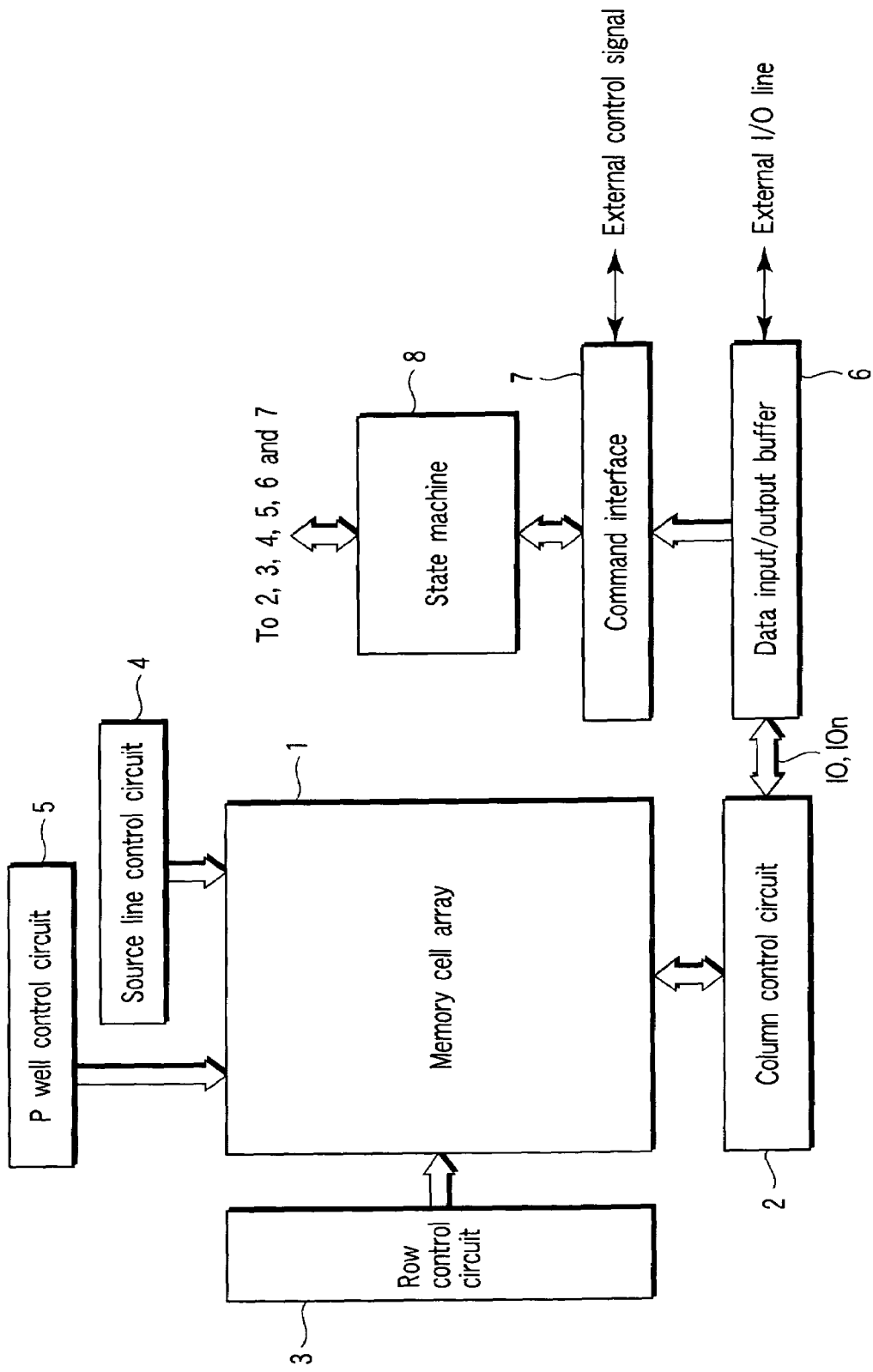
F I G. 1

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-183483, filed Jun. 23, 2005, the entire contents of which are incorporated herein by reference.

BACKGROUND OF THE INVENTION

1. Field of the Invention

The present invention relates to a semiconductor integrated circuit device. In particular, the present invention relates to a semiconductor integrated circuit device including a data rewritable non-volatile semiconductor memory device.

2. Description of the Related Art

An electrically rewritable non-volatile semiconductor memory device, for example, a flash memory writes data in units of a page. In the write operation, program and verify are repeated. In the following description, the number of repeat times is called the loop count. The loop count is not infinite, but limited in some degree. If it is determined that write is sufficiently made before the program loop reaches the limited number of times, write status is set as "pass", and then, write with respect to the page ends. Conversely, if the program loop reaches the limited number of times in a state that write is not sufficient, write status is set as "fail", and then, write with respect to the page ends.

In the flash memory, for example, a NAND flash memory, several pages, for example, 32 pages, are collected to form a unit calling a block. The block is the data erase minimum unit.

As one of the specifications of a memory card, there is an average write speed of a block. If it is desired to determine the average write speed, it is recommended to measure the loop count of the entirety of one block. In order to determine the write speed, the following operation is required. Specifically, the loop count is measured when every write is completed with respect to one page. The foregoing operation is continued until write is completed with respect to the entirety of one block. Finally, the loop count thus measured is added together to obtain the total number of times.

However, according to the method of measuring the loop count when every write to one page is completed, much time is spent.

Reference document: JPN. PAT. APPLN. KOKAI Publication No. 5-314780

BRIEF SUMMARY OF THE INVENTION

A semiconductor integrated circuit device according to an aspect of the present invention comprises:

a page buffer storing write data;

several memory cells to which data is written in accordance with the write data stored in the page buffer; and a program loop accumulating counter accumulating and storing the loop count spent for data write to the several memory cells, and outputting the accumulated and stored number of program loops.

BRIEF DESCRIPTION OF THE SEVERAL VIEWS OF THE DRAWING

FIG. 1 is a block diagram showing the configuration of a semiconductor integrated circuit device according to a first embodiment of the present invention;

DETAILED DESCRIPTION OF THE INVENTION

Figure 2:
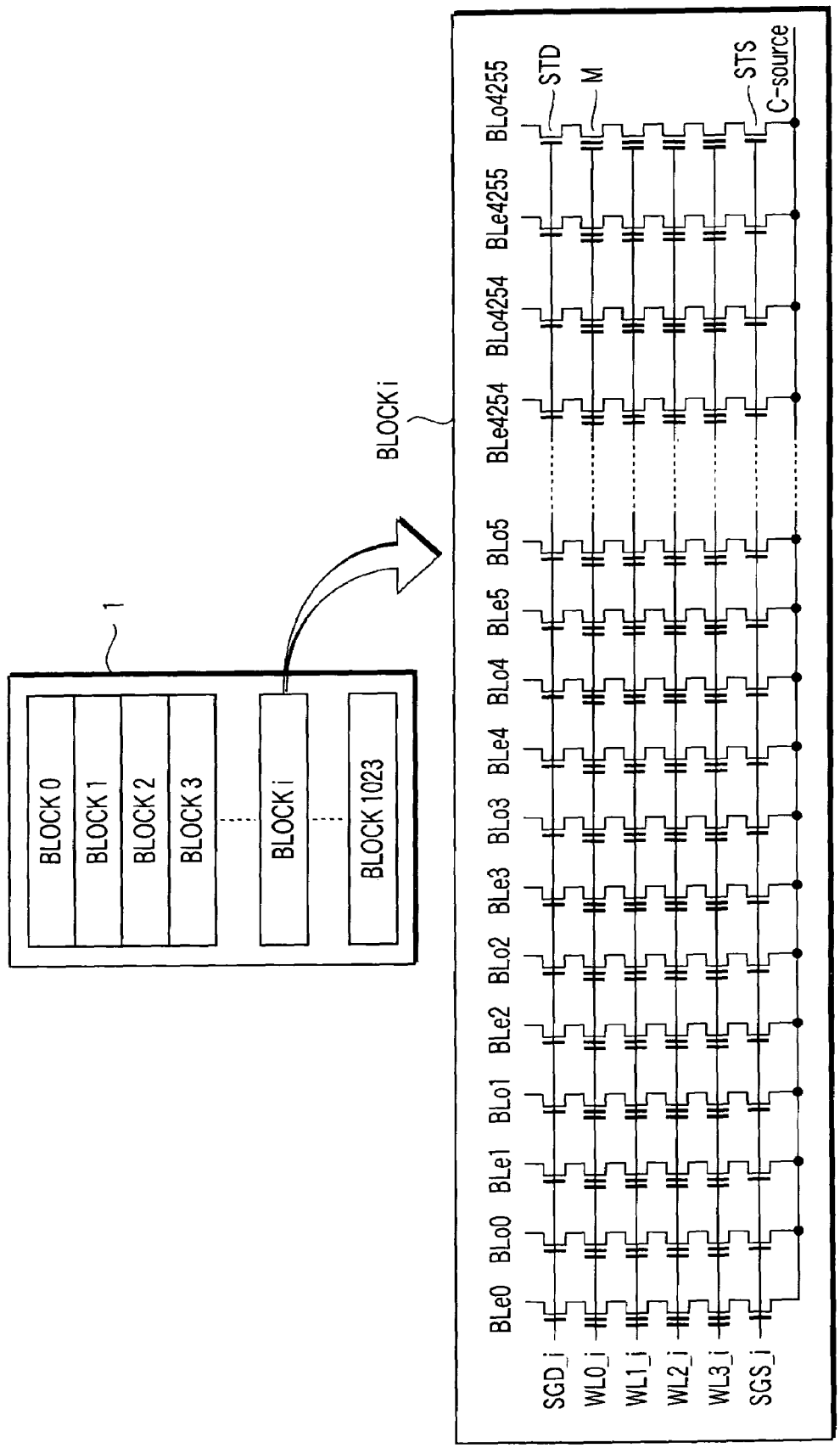
FIG. 2 is a view to explain a memory cell array shown in FIG. 1.

Several embodiments of the present invention will be described below with reference to the accompanying drawings. In the following description, the same reference numerals are used to designate the common portions all over the drawings.

First Embodiment

FIG. 1 is a block diagram showing the configuration of a semiconductor integrated circuit device according to a first embodiment of the present invention. In the first embodiment, a NAND flash memory is given as one example of the semiconductor integrated circuit device. The present invention is applicable to memories other than the NAND flash memory.

A memory cell array 1 has several non-volatile semiconductor memory cells arrayed like matrix. A flash memory cell is given as one example of the non-volatile semiconductor memory cell.

A column control circuit 2 controls bit lines of the memory cell array 1 to carry out data erase of the memory cell, data write thereto and data read therefrom. The column control circuit 2 is arranged adjacent to the memory cell array 1.

A row control circuit 3 selects word lines, and applies a potential (voltage) required for erase, write and read (operations).

A source control circuit 4 controls a source line of the memory cell array.

A P-well control circuit 5 controls a potential (voltage) of a P cell well formed with the memory cell array 1.

A data input/output buffer 6 is electrically connected with the column control circuit 2 via an IO line couple of IO; IOn, and is electrically connected with an external host (not shown) via an external IO line. The data input/output buffer 6 is provided with an input/output buffer circuit, for example. The data input/output buffer 6 receives write data while outputs read data, and receives address data and command data. The data input/output buffer 6 supplies the received write data to the column control circuit 2 via the IO line couple of IO; IOn, and receives data read from the column control circuit 2 via the same as above. Moreover, in order to select address of the memory cell array 1, the data input/output buffer 6 supplies externally input address data to column and row control circuits 2 and 3 via a state machine 8. The data input/output buffer 6 supplies command data from the external host to a command interface 7.

The command interface 7 receives a control signal from the external host via an external control signal line. Moreover, the command interface 7 determines whether data input to the data input/output buffer 6 is write data or command data or address data. If the input data is command data, the command interface 7 transfers it as command data to the state machine 8.

The state machine 8 manages the entirety of the flash memory. The state machine 8 receives command data from the external host, and manages read, write erase and data input/output.

FIG. 2 is a view to explain the memory cell array 1 shown in FIG. 1.

As shown in FIG. 2, the memory cell array 1 is divided into several blocks, for example, 1024 blocks BLOCK0 to BLOCK1023. The block is the minimum unit of erase. Each block, for example, BLOCKi includes several, that is, 8512 NAND memory units. In the first embodiment, each NAND memory unit includes two select transistors STD, STS, and several memory cells M (four in this embodiment) connected in series between these transistors. One terminal of the NAND memory unit is connected to a bit line BL via the select transistor STD connected to a select gate line SGD. The other terminal of the NAND memory unit is connected to a common source line C-source via the select transistor STS connected to a select gate line SGS. Each memory cell is connected with a word line WL. Data write and read are executed with respect to bit lines BLe and BLo, which are even and odd numbers when counting from 0, independently. Of 8512 memory cells connected to one word line WL, data write and read are simultaneously executed with respect to 4256 memory cells connected to the bit lines BLe. In this case, each memory cell M stores one-bit data, and 4256 memory cells are collected to form a unit of page. The page is the minimum unit of read. If one memory cell M stores two-bit data, 4256 memory cells stores data equivalent to two pages. Likewise, 4256 memory cells connected to the bit lines BLo form another two pages, and data write and read are simultaneously executed with respect to memory cells included in the page.

Figure 3:
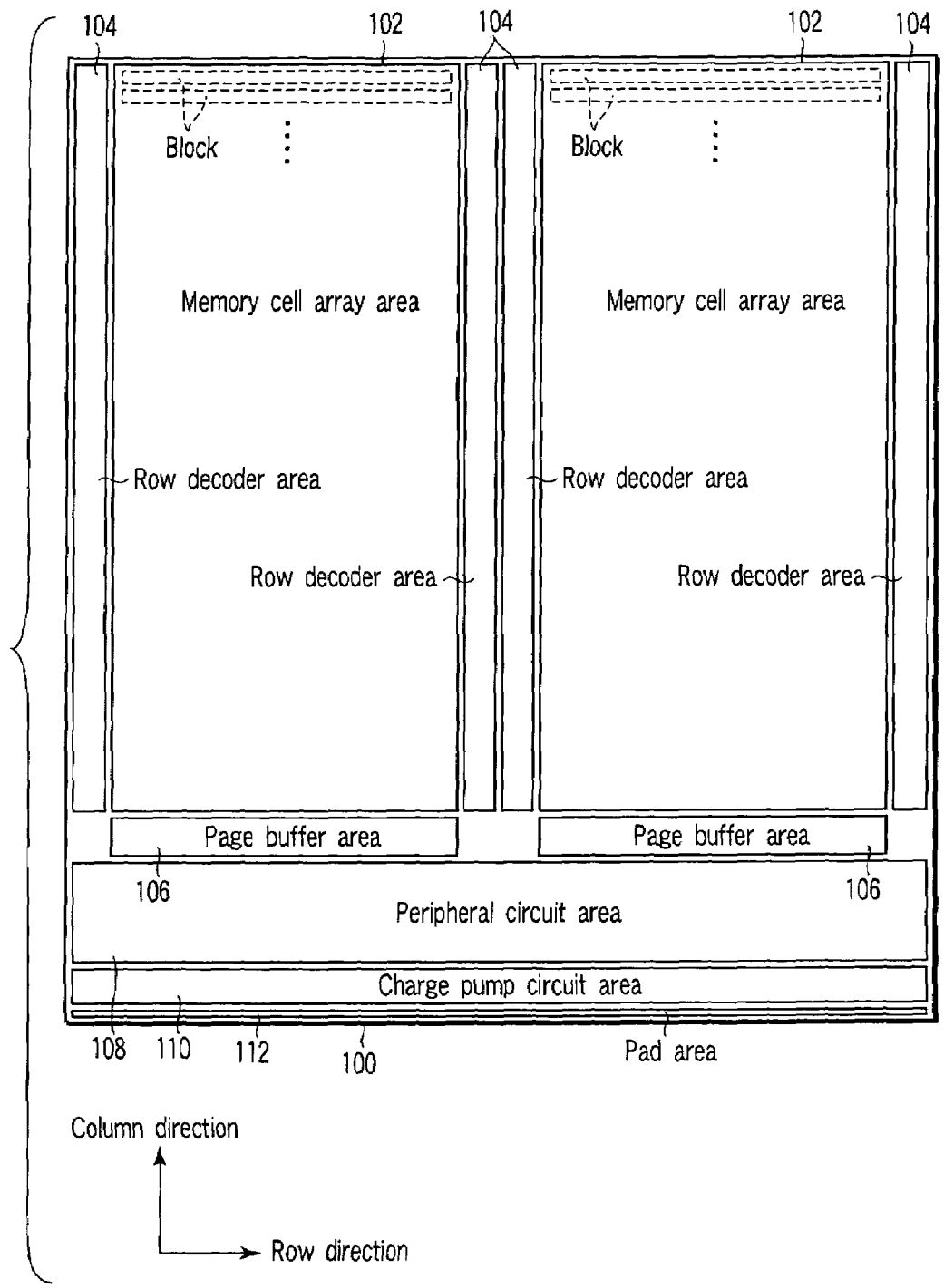
FIG. 3 is a top plan view showing the chip layout.

FIG. 3 is a top plan view showing one example of the chip layout.

As depicted in FIG. 3, a semiconductor chip 100 is provided with memory cell array area 102, row decoder area 104, page buffer area 106, peripheral circuit area 108, charge pump circuit area 110 and pad area 112.

According to the first embodiment, two memory cell array areas 102 are given, and further, provided with the memory cell array 1.

The row decoder area 104 is arranged on both sides of the memory cell array area 102 along the row direction. The row decoder area 104 is provided with the row control circuit 3.

The foregoing page buffer area 106, peripheral circuit area 108, charge pump circuit area 110 and pad area 112 are successively arranged on one side of the memory cell array areas 102 along the column direction.

The page buffer area 106 is provided with column control circuit, for example, page buffer. The page buffer is one kind of data circuit, and temporarily stores one-page write data written to the memory cell array 1, or temporarily stores one-page read data read therefrom.

The peripheral circuit area 108 is provided with column control circuit 2, data input/output buffer 6, command interface 7 and state machine 8.

The charge pump circuit area 110 is provided with a charge pump circuit. The charge pump circuit is one kind of step-up circuit, and generates power supply potential required for write or erase, for example, potential higher than external power supply potential and intra-chip power supply potential used in chip.

According to the first embodiment, one pad area 112 is given, and arranged along one side of the chip. The pad area 112 is provided with a pad. The pad functions as a connection point (node) connecting the semiconductor chip 100 with external devices. The pad is connected to data input/output buffer 6 and command interface 7.

The operation of the semiconductor integrated circuit device according to the first embodiment will be explained below.

In the first embodiment, operations other than write operation are the same as the conventionally known operation. Thus, the write operation will be explained in the following specification.

The flow of the write operation will be briefly explained.

Figure 4:
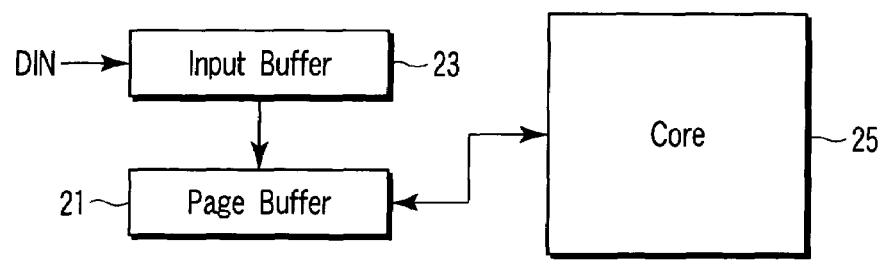
FIG. 4 is a block diagram to schematically explain the write data flow.
Figure 5:
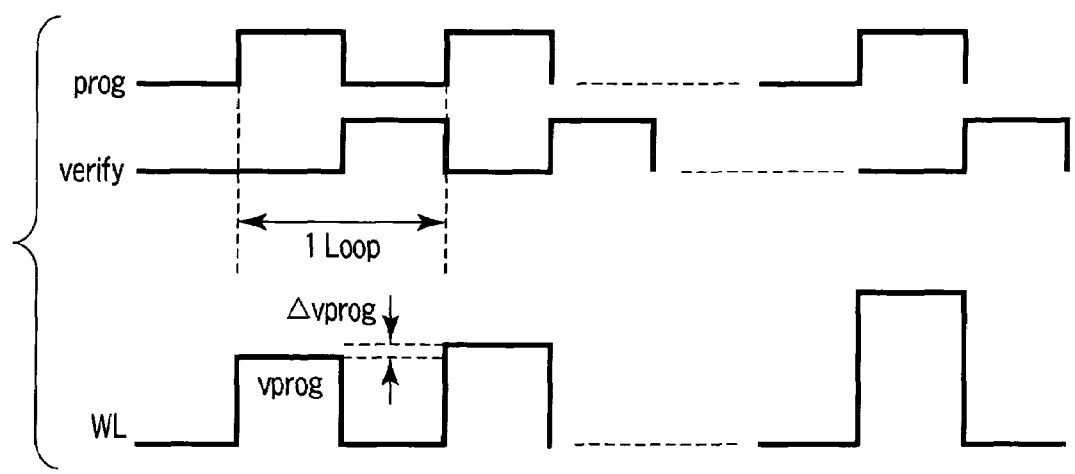
FIG. 5 is an operation waveform chart schematically showing the write operation.

FIG. 4 is a block diagram to schematically explain the write data flow, and FIG. 5 is an operation waveform chart schematically showing the write operation.

As seen from FIG. 4, externally input data DIN is successively captured in a page buffer 21 via an input buffer 23 of the data input/output buffer. When the data DIN is all captured in the page buffer 21, a program signal prog becomes active to command a core 25 to start the write operation. In the write operation, the word line WL is stepped up to a program voltage Vprog to write data to memory cell. The write is executed, and thereafter, a verify signal verify shown in FIG. 5 becomes active, and then, a verify operation starts. The verify operation is carried out; as a result, if write is pass, the write operation ends. On the other hand, if write is fail, the program voltage Vprog is stepped up to a step-up voltage AVprog, and thereafter, the write operation is again started. The number of times of repeating the foregoing "program→verify" is the loop count. The loop count is counted using a counter.

Figure 6:
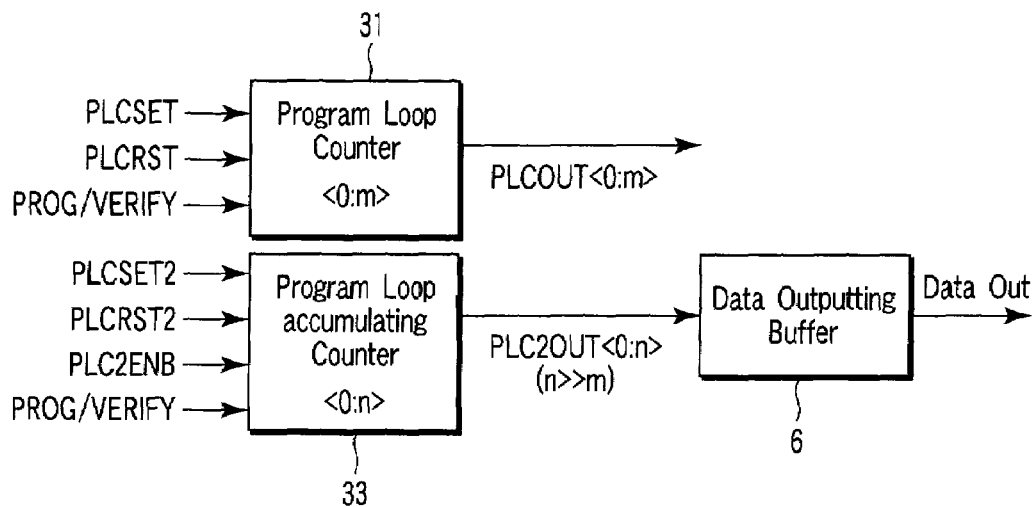
FIG. 6 is a block diagram showing the configuration of a counter included in the semiconductor integrated circuit device according to the first embodiment of the present invention.

FIG. 6 is a block diagram showing the configuration of counters included in the semiconductor integrated circuit device according to the first embodiment of the present invention.

The device according to this embodiment has the following counters for counting the loop count. One is a program loop counter 31 (hereinafter, referred to as "loop counter"). Another is a program loop accumulating counter 33 (hereinafter, referred to as "accumulating counter"). The loop counter 31 counts the loop count every one-word line, for example, for each page. The accumulating counter 33 accumulates and counts the loop count every several word lines, for example, ranging over the entirety of block in this embodiment.

Figure 7:
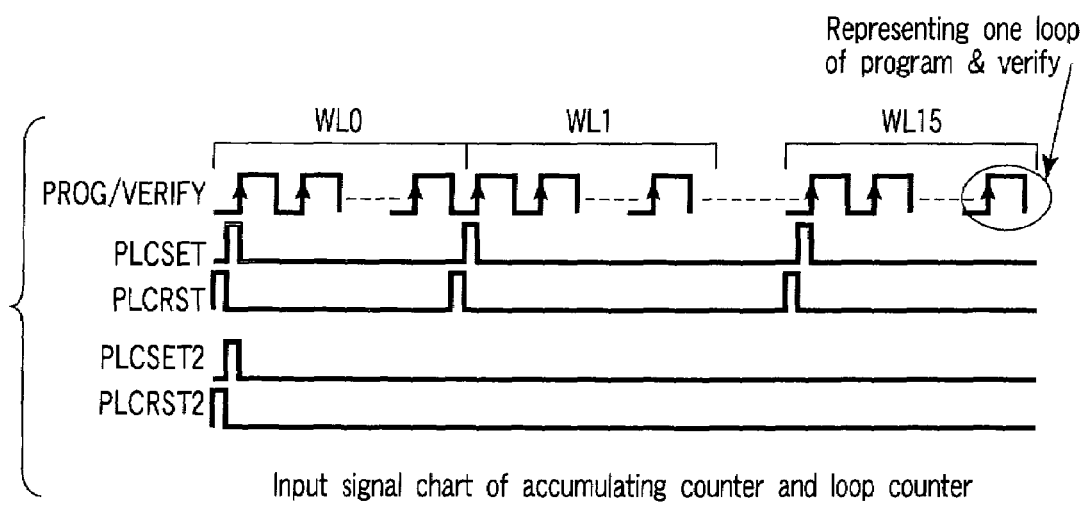
FIG. 7 is a signal waveform chart showing the input signal to loop counter and accumulating counter.

FIG. 7 is a waveform chart showing the input signals to the foregoing loop counter 31 and accumulating counter 33.

The loop counter 31 is reset when a reset signal PLCRST is input, and set to start count when a set signal PLCSET is input. According to the way to count, it is recommended to count a rise of a signal PROG/VERIFY.

Likewise, the accumulating counter 33 is reset when a reset signal PLCRST2 is input, and set to start count when a set signal PLCSET2 is input. According to the way to count, it is recommended to count a rise of the signal PROG/VERIFY, like the loop counter 31.

The foregoing loop counter 31 and accumulating counter 33 are reset and set before write to memory cell, that is, before write start to the memory cell connected to the word line WL0 in the embodiment. The loop counter 31 is reset when write to the memory cell connected to the word line WL0 is completed. Then, the loop counter 31 is set before when write to the next memory cell, that is, before write start to the memory cell connected to the word line WL1. In the manner described above, the loop counter 31 is reset every when data write is completed for each word line, and then, set.

Conversely, the accumulating counter 33 is not reset even if data write is completed for each word line. Thus, the accumulating counter 33 accumulates and counts the loop count spent for data write for each word line.

According to the first embodiment, the accumulating counter 33 is not supplied with the reset signal just after data write to the memory cell connected to the last word line WL15 is completed. This serves to temporarily hold the loop count thus accumulated. In other words, the accumulating counter 33 accumulates and stores the loop count spent for all programs of data write to several memory cells, that is, word lines WL0 to WL15. Then, the accumulating counter 33 outputs the loop count accumulated and stored therein (PLC2OUT). The output PLC2OUT is outputted outside the semiconductor integrated circuit device via the data outputting buffer of the data input/output buffer 6. After the loop count is outputted or when the next write operation starts, the accumulating counter 33 is reset.

As seen from FIG. 6, the accumulating counter 33 of this embodiment is supplied with an enable signal PLC2ENB. The accumulating counter 33 is operable only when the enable signal PLC2ENB is input. In order not to operate the accumulating counter 33, the enable signal PLC2ENB is set to become non-active. For example, it is desired not to operate the accumulating counter 33 when the semiconductor integrated circuit device is in a normal use mode. Conversely, it is desired to operate the accumulating counter 33 when the semiconductor integrated circuit device is in a test mode in factory. Therefore, the enable signal PLC2ENB may be set to become active when the semiconductor integrated circuit device is in a test mode.

The circuit configuration of the foregoing loop counter 31 and accumulating counter 33 will be explained below.

The loop counter 31 of this embodiment is a binary counter having m+1 bit output PLCOUT<0:m>. Likewise, the accumulating counter 33 of this embodiment is a binary counter having n+1 bit output PLC2OUT<0:n>. The output bit count of the accumulating counter 33 is more than that of the loop counter 31. For this reason, the accumulating counter 33 requires many flip-flop circuits as compared with the loop counter 31.

Figure 8A:
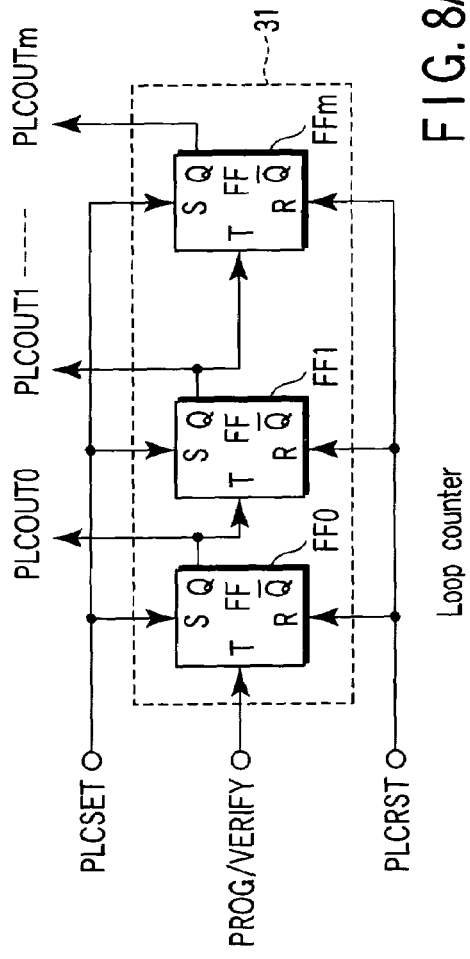
FIG. 8A is a circuit diagram showing the configuration of a loop counter.
Figure 8B:
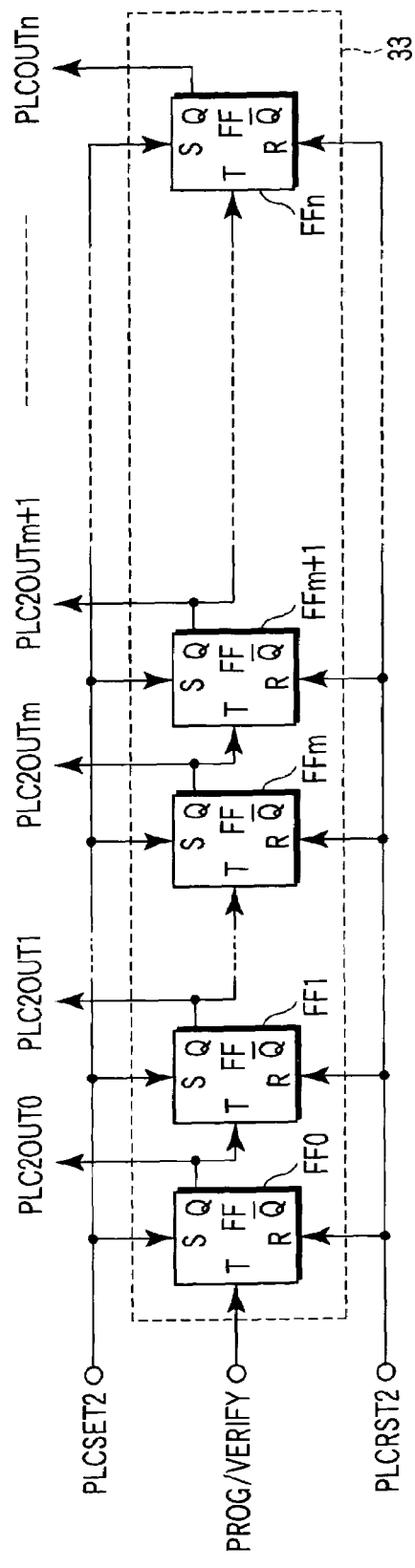
FIG. 8B is a circuit diagram showing the configuration of an accumulating counter.

FIG. 8A shows the circuit configuration of the loop counter 31, and FIG. 8B shows the circuit configuration of the accumulating counter 33. For example, a flip-flop circuit FF of the accumulating counter 33 is set as n+1 while a flip-flop circuit FF of the loop counter 31 is set as m+1. In this case, the relationship between "n" and "m" is n>>m. Thus, the accumulating counter 33 requires many flip-flop circuits as compared with the loop counter 31. However, the increased flip-flop circuit FF is a little as compared with all circuits integrated in a NAND flash memory chip. Therefore, the accumulating counter 33 neither greatly increases the chip area nor gives hindrance to the circuit layout.

The flow of the write operation will be explained below.

Figure 9:
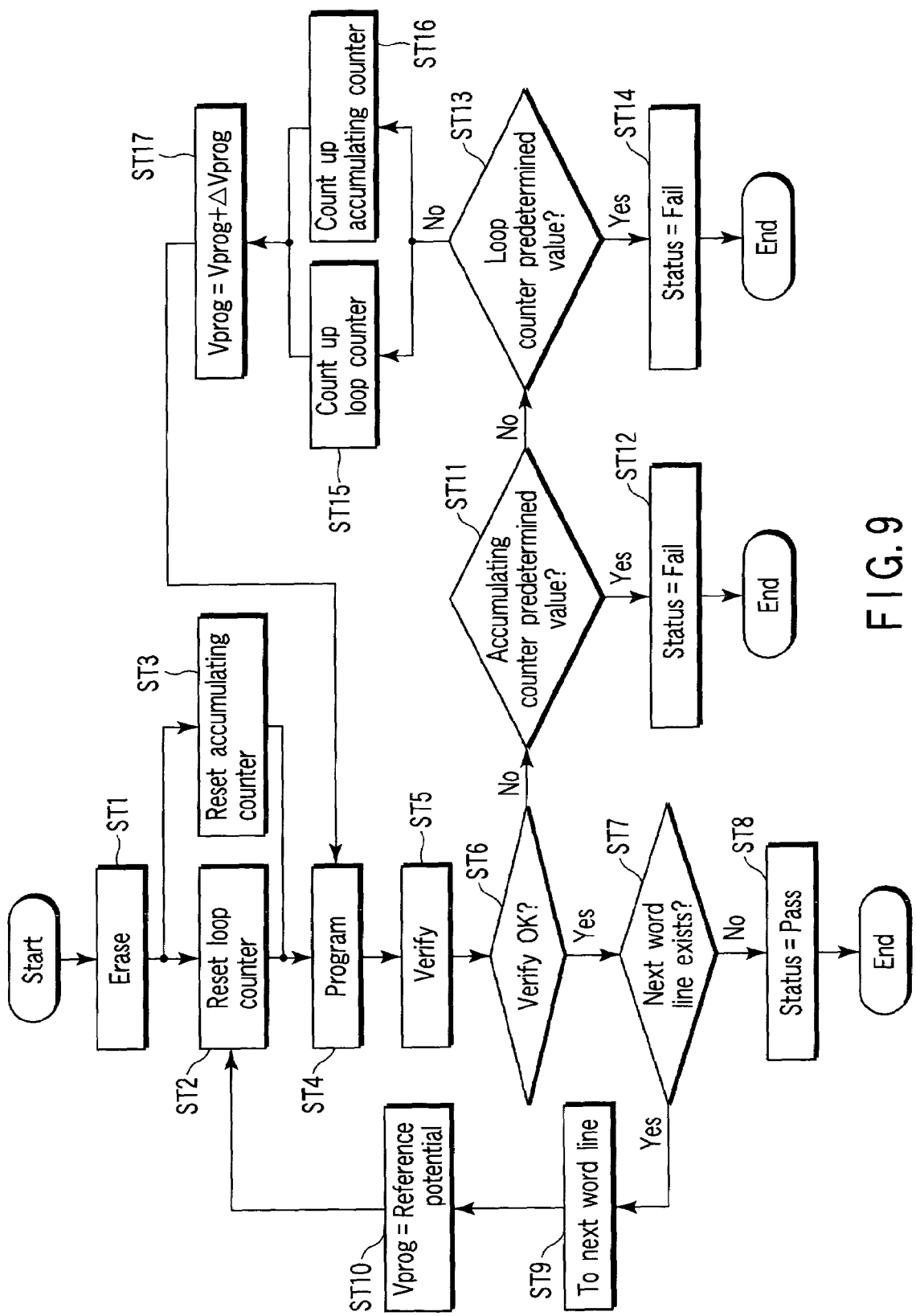
FIG. 9 is a flowchart to explain the write operation.

FIG. 9 is a flowchart to explain the write operation.

As shown in FIG. 9, data is erased from the block to which write is executed (ST1).

Loop and accumulating counters are reset (ST2, ST3). Incidentally, the accumulating counter may be set to become non-active in a normal operation while to become active in a test operation only. In this case, the accumulating counter is reset in the test operation only. Data write is executed, and then, written data is verified (ST5, ST6).

If verify is OK (YES), it is determined whether or not the next write word line exists (ST7). If the next write word line does not exist, the status is set as pass (ST8), and thereafter, the write operation ends. On the other hand, if the next write word line exists, the write operation is shifted to the next write word line (ST9). The flow returns to the foregoing step ST2 to reset the loop counter using write potential Vprog as a reference potential (ST10). In the same manner as the foregoing operation, write is executed, and written data is verified (ST5, ST6).

If verify is NG (NO), it is determined whether or not the accumulating counter reaches a predetermined value (ST11). If the accumulating counter reaches the predetermined value, the status is set as fail (ST12), and then, the write operation ends. On the other hand, if the accumulating counter does not reach the predetermined value, it is determined whether or not the loop counter reaches a predetermined value (ST13). If the loop counter reaches the predetermined value, the status is set as fail (ST14), and then, the write operation ends. If it does not reach the predetermined value, the foregoing loop and accumulating counters are individually counted up (ST15, ST16). The flow is returned to step ST4, and then, write is executed using write potential Vprog stepped up by ΔVprog. The foregoing operation is repeated after that.

In the foregoing operation, the accumulating counter is reset before the write operation is carried out, and is not reset during the write operation. Therefore, it is possible to accumulate and store the loop count spent for data write during the write operation. Incidentally, the accumulating counter may be reset before or after the write operation is carried out as described above. Namely, the accumulating counter may be reset anytime so long as it accumulates and stores the loop count spent for data write.

According to the first embodiment, the accumulating counter is provided, and thereby, the loop count is accumulated and stored even if page changes in the write operation. For example, the loop count accumulated and stored in the accumulating counter is investigated after write to the entirety of the block is completed. By doing so, it is possible to readily know the loop count spent for write to the entirety of the block. The loop count accumulated and stored in the accumulating counter is output in a test mode, for example. This is used as data of the case where it is desired to know a write speed for each block.

Conventionally, the following operation has been required in order to know the loop count spent for write to the entirety of one block. Specifically, the write operation is stopped every when write to one page is completed and before the loop counter is reset. Thereafter, the loop count held in the loop counter has been investigated. The operation described above must be carried out with respect to all pages of the block. For this reason, huge processing time is spent, and troublesome work must be done. For example, if one block has 16 pages, the write operation must be stopped 16 times. Moreover, if one block has 32 pages, the stop of the write operation reaches 32 times.

Conversely, according to the first embodiment, there is no need of stopping the write operation every when write to one page is completed. For example, when write to one page is completed, the write operation is stopped to investigate the loop count accumulated and stored in the accumulating counter. In addition, according to the first embodiment, even if one block has 16 pages or 32 pages or pages more than those, the stop of the write operation is only one time.

As is evident from the foregoing first embodiment, it is possible to readily know the loop count spent for write to the entirety of one block. In addition, processing time is shortened, and the operation is simplified.

As one of the specifications of a memory card, there is an average write speed of a block. One block is a unit of replacement. By obtaining an average write speed for each block, it can be checked whether the block satisfies the specification of the average write speed. If the block does not satisfy the specification, it is replaced with a spare block. A semiconductor integrated circuit chip such as a NAND flash memory chip is therefore remedied. The average write speed of one block can be known from the number of times of execution of a program loop of the block. When the above remedy is adopted, the first embodiment is useful since the number of times of execution of a program loop of one block can be known in a short time.

The number of spare blocks is limited and thus some chips cannot be remedied. Since the number of times of execution of a program loop of one block can be known in a short time in the first embodiment, remediable chips and irremediable chips can be screened in a short time. This is useful in improving the throughput of the semiconductor integrated circuit chip such as a NAND flash memory.

According to the first embodiment, the stop of the write operation is only one time regardless of the number of pages included in one block. Therefore, the first embodiment is advantageously applicable to an increase of storage capacity, for example, an increase of the number of pages integrated in one block.

Second Embodiment

The second embodiment differs form the first embodiment in that a semiconductor integrated circuit chip determines the chip validity by itself, for example, determines whether the chip is pass or fail.

Figure 10:
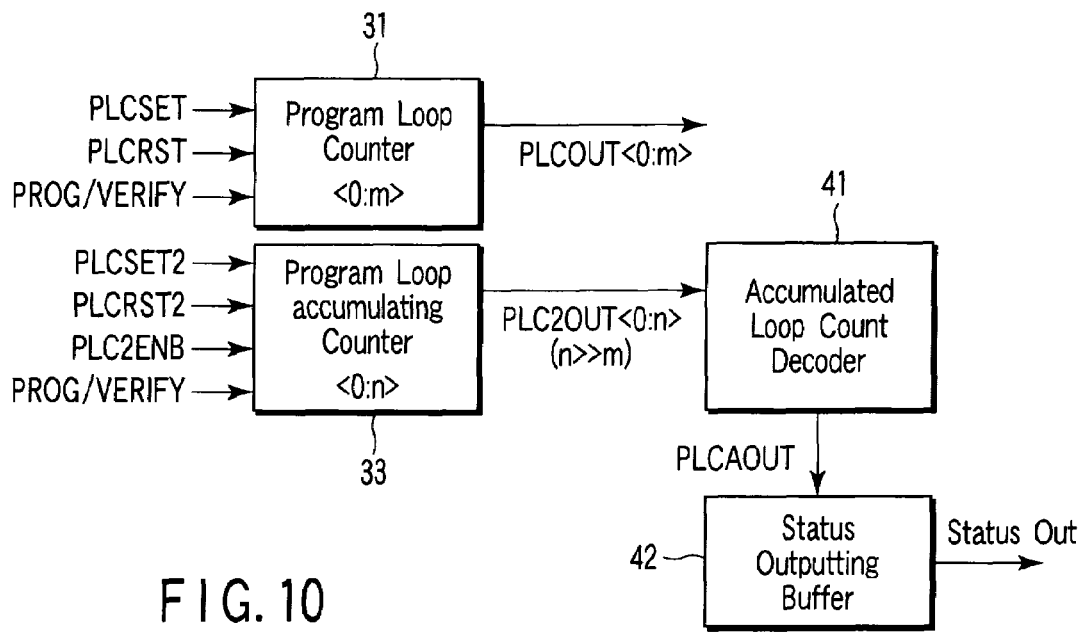
FIG. 10 is a block diagram showing one example of a semiconductor integrated circuit device according to a second embodiment of the present invention.

FIG. 10 is a block diagram showing a semiconductor integrated circuit device according to a second embodiment of the present invention.

The semiconductor integrated circuit device of the second embodiment has an accumulated loop count decoder 41 for decoding the output of the accumulating counter 33, as shown in FIG. 10. The decoder 41 calculates an average loop count from the output PLC2OUT indicative of the loop count accumulated and stored and the number of pages included in one block, and thereafter, outputs it.

The semiconductor integrated circuit device of the second embodiment further has a status outputting buffer 42. The status outputting buffer 42 determines whether the average loop count is more or less than an estimated average loop, and outputs the result as a status. For example, if the average loop count is more than the estimated average loop count, the status is set as "fail". On the other hand, if the average loop count is less than then estimated average loop count, the status is set as "pass". The status is not limited to the foregoing "fail" and "pass"; in this case, it may be set in accordance with a write speed. For example, "fast write speed class" and "slow write speed class" are given.

The features (configuration) of the second embodiment will be explained below.

For example, if a status command is input from the outside, it is determined whether or not the loop count spent for write to the entirety of one block is less than the estimated average loop count. The result is output as the status using "pass" or "fail".

Figure 11:
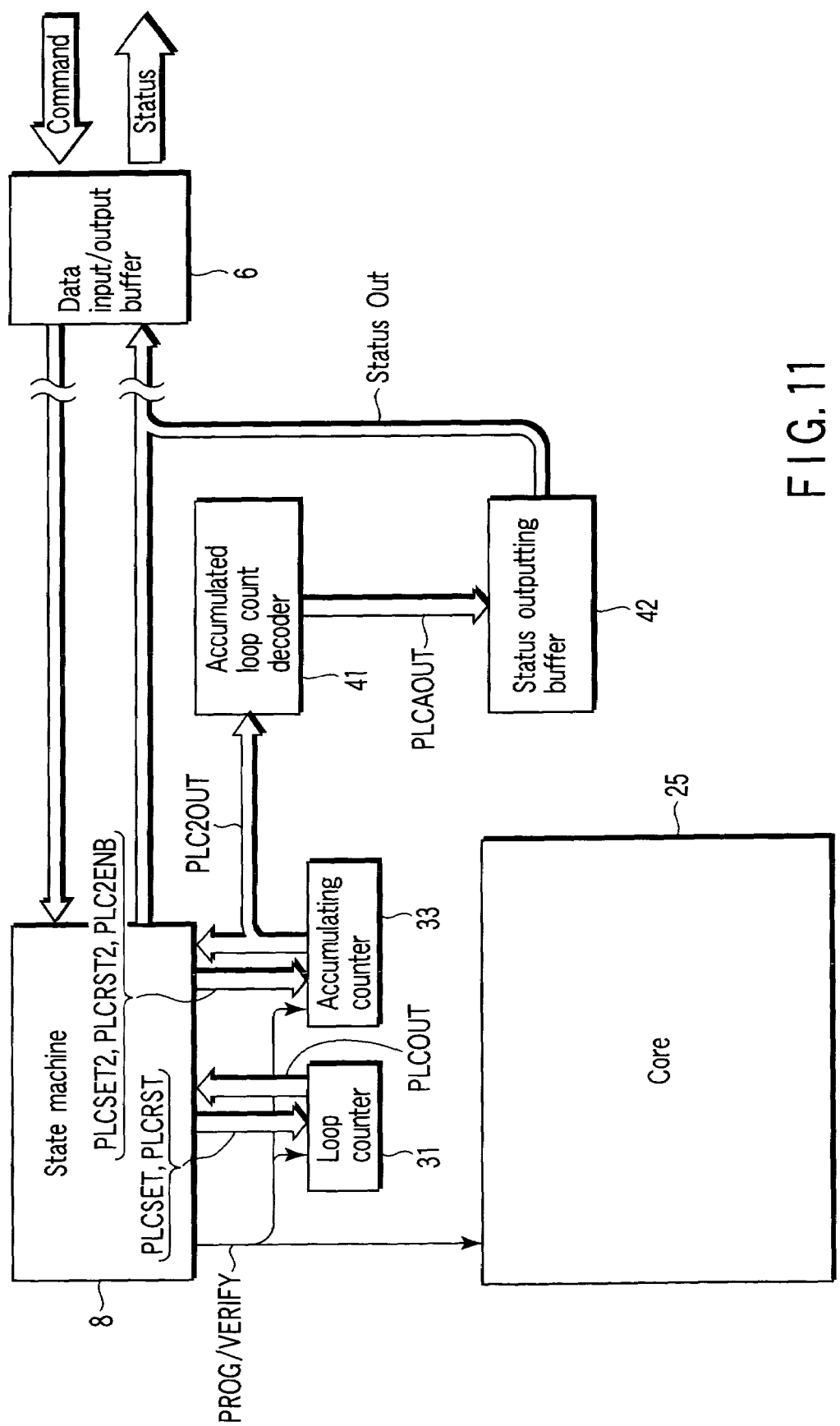
FIG. 11 is a block diagram showing the configuration of a semiconductor integrated circuit device according to a second embodiment of the present invention.

FIG. 11 is a block diagram showing the configuration of a semiconductor integrated circuit device according to a second embodiment of the present invention.

As illustrated in FIG. 11, a status command is input to the data input/output buffer 6. The input status command is supplied to the state machine 8. When determining that the input status command is "block average program loop read", the state machine 8 starts the write operation shown in FIG. 9.

Specifically, the state machine 8 outputs the enable signal PLC2ENB to activate the accumulating counter 33. Then, the state machine 8 outputs reset signals PLCRST and PLCRST2 to reset the loop counter 31 and the accumulating counter 33. The state machine 8 outputs set signals PLCSET and PLCSET2 to set the loop counter 31 and the accumulating counter 33. Thereafter, the state machine 8 outputs a program/verify signal PROG/VERIFY to a core 25. According to the foregoing signal, the core 25 repeats write and verify operations. The program/verify signal PROG/VERIFY is input to the loop counter 31 and the accumulating counter 33. The loop counter 31 counts the loop count every one page like the first embodiment. The accumulating counter 33 counts the loop count equivalent to one block like the first embodiment.

When data write equivalent to one block is completed, the accumulating counter 33 outputs an output PLC2OUT. The output PLC2OUT is input to the accumulated loop count decoder 41. The decoder 41 calculates an average loop count from the output PLC2OUT and the number of pages included in one block. The decoder 41 outputs the calculated average loop count as an output PLCAOUT. The output. PLCAOUT is input to the status outputting buffer 42. The status outputting buffer 42 determines whether the average loop count is more or less than the estimated average loop count. For example, the status outputting buffer 42 outputs a status output "Status Out" as described referring to FIG. 6. If the average loop count is more than the estimated average loop count, the buffer 42 sets the status output "Status Out" as "fail" or "slow write speed class". On the other hand, the average loop count is less than the estimated average loop count, the buffer 42 sets the status output "Status Out" as "pass" or "fast write speed class".

The status output "Status Out" is input to the data input/output buffer 6. The data input/output buffer 6 outputs the foregoing status outside the chip.

Figure 12:
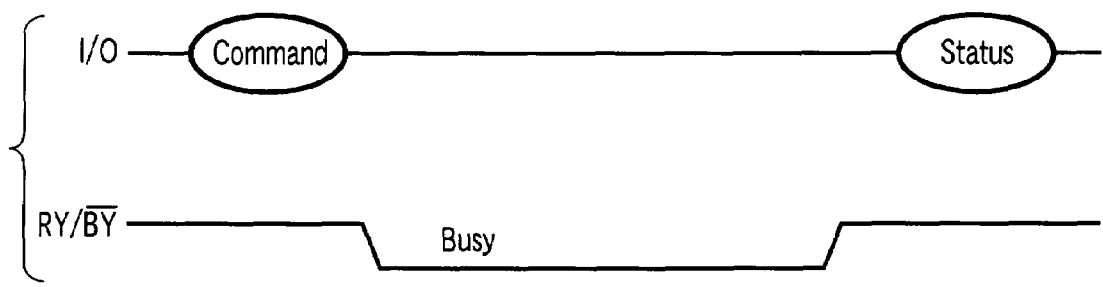
FIG. 12 is a waveform chart showing one input/output waveform from status command input to status output.

FIG. 12 is a waveform chart showing one input/output waveform from status command input to status output.

As seen from FIG. 12, when a status command is input to an I/O pin of the chip, a ready/busy pin transfers from a high level to a low level, and thereby, information that the chip is in a busy state is given outside. During the busy state, the foregoing write operation is carried out in the chip. When the ready/busy pin transfers from the low level to the high level and the chip returns to the ready state, a status is output to the I/O pin.

According to the second embodiment, the semiconductor integrated circuit chip calculates an average program loop count spent for write to one page of one block. Based on the calculated average program loop count, the chip determines which the self is "pass", "fail", "fast write speed class" or "slow write speed class".

Therefore, according to the second embodiment, the operation is further simplified as compared with the first embodiment.

Another input/output waveform from status command input to status output will be explained below.

For example, when the following case is given, counters output "status=fail". Specifically, the accumulating counter outputs the status when the count reaches (or exceeds) the predetermined value. Likewise, the loop counter outputs the status when the count reaches (or exceeds) the predetermined value. The foregoing status in the foregoing case may be reflected to the second embodiment.

Figure 13:
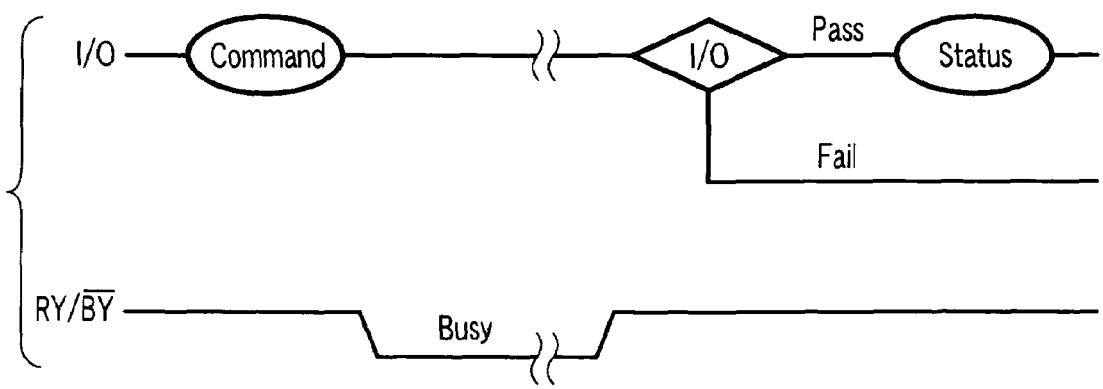
FIG. 13 is a waveform chart showing another input/output waveform from status command input to status output.

FIG. 13 is a waveform chart showing another input/output waveform from the foregoing status command input to status output.

As seen from FIG. 13, the point different from the input/output waveform shown in FIG. 12 is as follow. Namely, before the status is output to the I/O pin, a status showing which the write is "pass" or "fail" is output.

If "fail" is output to the I/O pin, the case is given when the count of the accumulating counter reaches (or exceeds) the predetermined value, or when the count of the loop counter reaches (or exceeds) the predetermined value. This implies that write to block is not executed, that is, the block is a bad block.

Conversely, if "pass" is output to the I/O pin, this implies that write to block is executed regardless of the average program loop count. Namely, the block is a good block.

Thus, the status with respect to "block average program loop read" may be output to the I/O pin only when the block is a good block, that is, only when "pass" is output to the I/O pin. In this case, the next output status may be any of "pass", "fail", "fast write speed class" or "slow write speed class".

For example, if "pass" or "fast write speed class" is output after "pass", the chip has successes in write to the block, and it can be seen that the count is less than the average program loop count (or less). Of course, it can be seen that the written block is a good block.

If "fail" or "slow write speed class" is output after "pass", the chip has successes in write to the block, and it can be seen that the count exceeds the average program loop count (or more). Of course, it can be seen that the written block is a good block.

The foregoing second embodiment (another input/output waveform?) is used, and thereby, it is determined whether the block itself is a good or bad block according to the status command input. Therefore, the second embodiment is applicable to a test process of the chip, for example, a screening process.

If the status is represented using fast or slow write speed, three-, four-stage, . . . multi-stage indication may be used, and not two-stage indication. For example, the write speed is classified into "high-speed class", "intermediate-speed class" and "low-speed class" in accordance with the average program loop count.

As described above, the chip is classified in accordance with the write speed, and thereby, various-class memory chips are integrated in an IC card, for example, a memory card. By doing so, the memory card is classified in accordance with the writer speed. For example, the memory card is classified into "ultra-high-speed product", "high-speed product" and "standard product".

The memory card is classified in accordance with the writer speed, and thereby, a user can select any one of "ultra-high-speed product", "high-speed product" and "standard product" in accordance with his favorite. This is convenient to the user.

The first and second embodiments including the memory capable of readily knowing the program loop count of the entirety of one block are preferable to IC cards, for example, memory cards.

The present invention has been described using some embodiments; however, the present invention is not limited to these embodiments. In the work stage, various modifications may be made within the scope without diverging from the subject matter of this invention.

The foregoing embodiments may be solely carried out; in this case, these embodiments may be properly combined.

The foregoing embodiments include various inventive steps, and several constituent components disclosed in the embodiments are properly combined, and thereby, various step inventions may be selected.

The foregoing embodiments have been explained giving the case where the present invention is applied to the NAND flash memory as one example. However, the present invention is not limited to the NAND flash memory. The present invention is applicable to various AND, NOR flash memories other than the NAND flash memory. Semiconductor integrated circuit devices having a built-in flash memory, for example, a processor and system LSI are included in the category of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor integrated circuit device comprising:
a page buffer storing write data;
several memory cells to which data is written in accordance with the write data stored in the page buffer;
a program loop accumulating counter accumulating and storing a program loop count spent for data write to said several memory cells, and outputting the accumulated and stored number of program loops; and
a program loop counter counting a program loop count every the word line;
the program loop counter being reset when data write every word line is completed;
the program loop accumulating counter not being reset even if data write every word line is completed,
wherein said several memory cells are connected to different word lines, and these word lines form a block, and further, the program loop accumulating counter accumulates and stores a program loop count of the entirety of the block.

2. The device according to claim 1, wherein the program loop count accumulated and stored in the program loop accumulating counter is output in a test mode.

3. The device according to claim 1, wherein semiconductor integrated circuit device is applicable to an IC card.

4. The device according to claim 2, wherein semiconductor integrated circuit device is applicable to an IC card.

5. A semiconductor integrated circuit device comprising:

a page buffer storing write data;

several memory cells to which data is written in accordance with the write data stored in the page buffer;

a program loop accumulating counter accumulating and storing a program loop count spent for data write to said several memory cells, and outputting the accumulated and stored number of program loops; and a status output buffer outputting a status representing fail or slow write speed class if the program loop count is more than a predetermined count based on the program loop count accumulated and stored in the program loop accumulating counter.

6. The device according to claim 5, wherein the status is output based on a status command input.

7. The device according to claim 5, wherein semiconductor integrated circuit device is applicable to an IC card.

8. A semiconductor integrated circuit device comprising:

a page buffer storing write data;

several memory cells to which data is written in accordance with the write data stored in the page buffer;

a program loop accumulating counter accumulating and storing a program loop count spent for data write to said several memory cells, and outputting the accumulated and stored number of program loops; and a status output buffer outputting a status representing fail or slow write speed class if an average program loop count of entirety of a block of word lines is more than a predetermined count based on the program loop count accumulated and stored in the program loop accumulating counter.

9. The device according to claim 8, wherein the status is output based on a status command input.

10. The device according to claim 8, wherein semiconductor integrated circuit device is applicable to an IC card.

11. The device according to claim 9, wherein semiconductor integrated circuit device is applicable to an IC card.

12. The device according to claim 6, wherein semiconductor integrated circuit device is applicable to an IC card.

* * * * *